United States Patent [19]
Grist et al.

[11] Patent Number: 5,500,596
[45] Date of Patent: Mar. 19, 1996

[54] LOCAL COIL ARRAY FOR MAGNETIC RESONANCE IMAGING OF THE LOWER EXTREMITIES

[75] Inventors: Thomas M. Grist; Marcus T. Alley, both of Madison, Wis.

[73] Assignee: Wisconsin Alumni Research Foundation, Madison, Wis.

[21] Appl. No.: 234,888

[22] Filed: Apr. 28, 1994

[51] Int. Cl.$^6$ ................................................. G01R 33/28
[52] U.S. Cl. ........................ 324/318; 324/322; 128/653.5
[58] Field of Search ................................ 324/322, 318, 324/314, 300; 128/653.5

[56] References Cited

U.S. PATENT DOCUMENTS

| | | | |
|---|---|---|---|
| 4,721,913 | 1/1988 | Hyde et al. | 324/318 |
| 4,724,389 | 2/1988 | Hyde et al. | 324/318 |
| 4,752,738 | 6/1988 | Patrick et al. | 728/653.5 |
| 4,825,162 | 4/1989 | Roemer et al. | 324/318 |
| 5,057,777 | 10/1991 | Kurczewski | 324/322 |
| 5,198,768 | 3/1993 | Keren | 324/318 |
| 5,270,656 | 12/1993 | Roberts et al. | 324/322 |
| 5,277,183 | 1/1994 | Vij | 324/318 |
| 5,280,248 | 1/1994 | Zou et al. | 324/318 |
| 5,307,806 | 5/1994 | Jones | 324/318 |
| 5,361,764 | 11/1994 | Reynolds et al. | 324/318 |

FOREIGN PATENT DOCUMENTS

| | | |
|---|---|---|
| 0191180 | 8/1986 | European Pat. Off. . |
| 04322639 | 11/1992 | Japan . |
| 04354934 | 12/1992 | Japan . |

Primary Examiner—Sandra L. O'Shea
Assistant Examiner—Raymond Y. Mah
Attorney, Agent, or Firm—Quarles & Brady

[57] ABSTRACT

A local coil for use with an MRI system to acquire images of a patient's legs includes a vertically disposed central coil positioned between the legs, and a pair of horizontally disposed flange coils positioned above and below the legs. In one embodiment of the central coil is a phased array of two coils, and the four coils are connected to the respective inputs of a four channel receiver, and in a second embodiment, the signals from the three coils are combined before application to the input of a single-channel receiver.

5 Claims, 4 Drawing Sheets

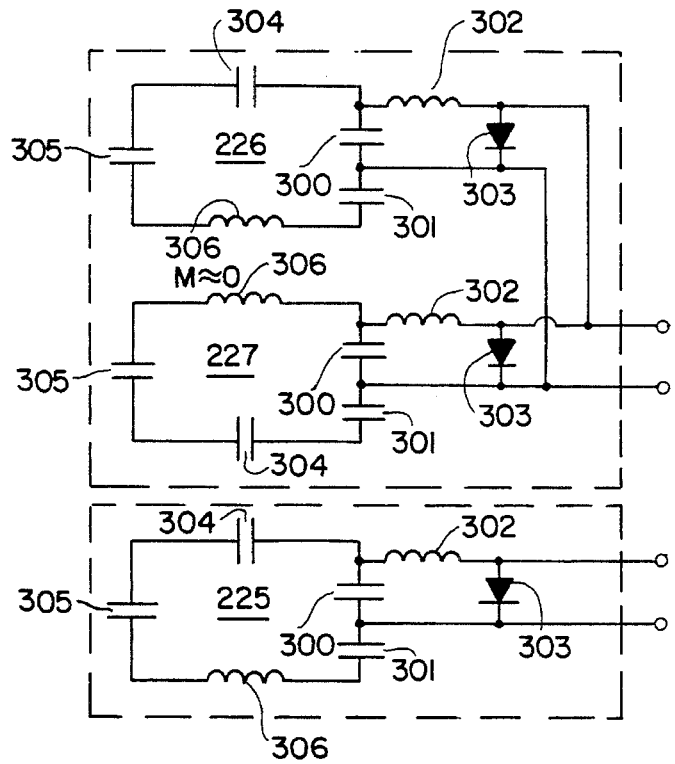
FIG. 5
FIG. 4
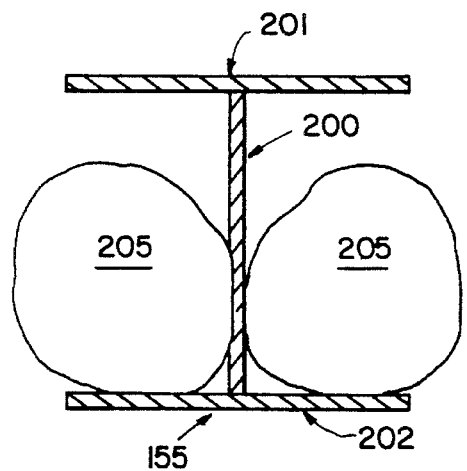
FIG. 6
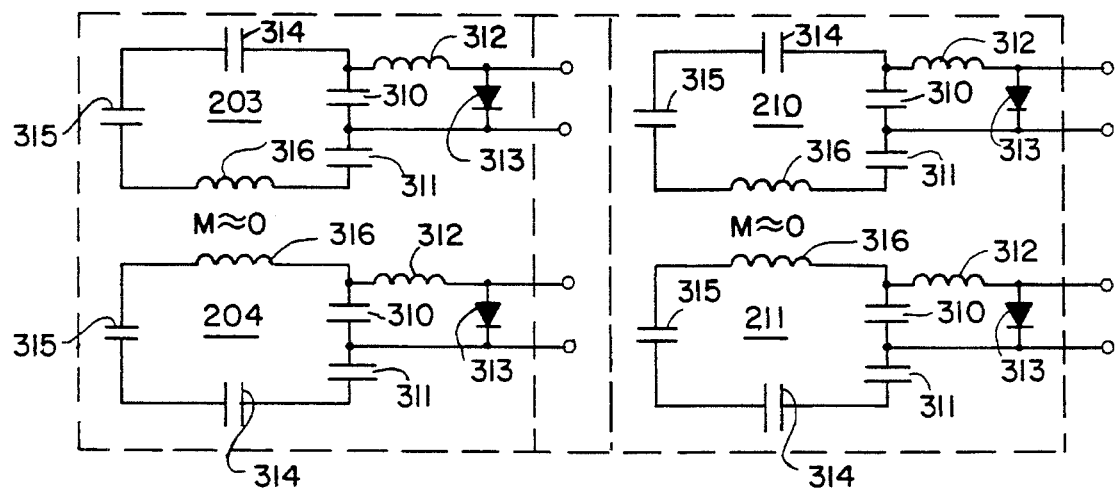

under the fields of view of each coil in these local coil arrays is different, but they overlap to provide a substantially constant sensitivity over their combined fields of view. The high SNR of each local coil in the array is maintained by arranging them such that the mutual inductance between them is minimized.

LOCAL COIL ARRAY FOR MAGNETIC RESONANCE IMAGING OF THE LOWER EXTREMITIES

BACKGROUND OF THE INVENTION

The field of the invention is nuclear magnetic resonance imaging ("MRI") and magnetic resonance angiography ("MRA"). More particularly, the invention relates to local coils used to receive NMR signals from specific regions of the human anatomy.

Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant γ of the nucleus). Nuclei which exhibit this phenomena are referred to herein as "spins".

When a substance such as human tissue is subjected to a uniform magnetic field (polarizing field $B_o$), the individual magnetic moments of the spins in the tissue attempt to align with this polarizing field, but precess about it in random order at their characteristic Larmor frequency. A net magnetic moment M, is produced in the direction of the polarizing field, but the randomly oriented magnetic components in the perpendicular, or transverse, plane (x-y plane) cancel one another. If, however, the substance, or tissue, is subjected to a magnetic field (excitation field $B_1$) which is in the x-y plane and which is near the Larmor frequency, the net aligned moment, Mz, may be rotated, or "tipped", into the x-y plane to produce a net transverse magnetic moment $M_t$, which is rotating, or spinning, in the xy plane at the Larmor frequency. The practical value of this phenomenon resides in the signal which is emitted by the excited spins after the excitation signal $B_1$ is terminated. There are a wide variety of measurement sequences in which this nuclear magnetic resonance phenomena is exploited.

Commercially available NMR imaging systems utilize a coil which surrounds the entire patient for receiving the NMR signals produced by excited spins. Such "whole body coils" have the advantage that they are substantially uniformly sensitive to NMR signals produced over a large region to be imaged. However, because of their large size, whole body coils are relatively insensitive to NMR signals emanating from specific regions and they have a relatively large inductance. In addition, whole body coils receive noise from regions in the body outside the imaging region, thus further lowering the SNR ratio. Where more sensitivity is desired from a particular region of the human anatomy, it is common practice to employ a small "local" or "surface" coil which is shaped to provide increased sensitivity over the particular region of interest. Local coils designed for the knee, wrist, shoulder, neck or head, for example, have been designed. While such local coils provide images of these regions with an improved signal to noise ratio ("SNR") their fields of view are very limited. They are not appropriate, therefore, for imaging an elongated region such as the leg without repeatedly interrupting the scan and repositioning the local coil over a different segment of the leg.

As described in U.S. Pat. Nos. 4,721,913 and 4,825,162, it is possible to employ an array of local coils in such a way that the field of view of the combined signals they receive is substantially increased without significantly reducing their sensitivity. The fields of view of each coil in these local coil When performing an NMR scan of the legs, the high SNR of a local coil is required. However, such scans must also gather NMR data from the entire length of the leg in order to completely image the vasculature. Currently, local coils such as that described in U.S. Pat. No. 4,724,389 are used for this purpose, and they must be moved many times during the scan to acquire NMR data from the entire leg. This is very time consuming and increases the cost of such scans very significantly. It is also very inconvenient for the patient.

SUMMARY OF THE INVENTION

The present invention is a local coil array which is particularly suited for acquiring NMR data from the legs of a patient. More specifically, the local coil array includes a central coil disposed in a first plane positioned between the patient's legs and extending along the lengthwise dimension of the legs; a flange coil disposed in a second plane substantially perpendicular to the first plane and disposed over the top of the patient's leg and extending along the lengthwise dimension coextensively with the central coil; and a second flange coil disposed in a third plane substantially perpendicular to the first plane and disposed beneath the patient's leg and extending along the lengthwise dimension coextensively with the central coil; and means for combining the signals from said three coils to acquire NMR signals from the patient's leg along the lengthwise dimension of said coils.

A general object of the invention is to provide improved MRI images of the vasculature in the human leg. The central coil is positioned along the inside of the leg in close proximity to important vessels. As a result, high SNR imaging data may be acquired with this coil. In addition, the flange coils are in close proximity to the leg, and because their fields are orthogonal to that of the central coil, mutual inductance therebetween is minimal and their signals may therefore be combined to further improve the SNR. The distance between the flange coils is sufficient that their mutual inductance is minimal and their signals may be combined to improve SNR.

Another object of the invention is to provide a local coil which extends along the length of the leg and reduces the need to move the coil during a scan of the entire leg. Each of the three coils may be comprised of an array of separate coils which are disposed next to one another along the lengthwise dimension of the leg to position their respective fields of view along successive parts of the leg. The mutual inductance between adjacent coils in each array is minimized so their signals may be combined to improve SNR throughout the elongated field of view of the array.

Yet another object of the invention is to provide a local coil which enables acquisition of image data from both legs. The cross sectional shape of the local coil is that of an "I" beam, with the central coil forming a vertical web and the two flange coils forming flanges which extend horizontally over the top and bottom of both legs. The field of view of these coils extends to both sides of the central coil to encompass both legs.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

BRIEF DESCRIPTION OF THE DRAWINGS

FIG. 4 is a pictorial view in cross section showing either of the local coils of FIGS. 2 or 3 in place for acquiring NMR data;

FIG. 5 is an electrical schematic diagram of the local coil of FIG. 3;

FIG. 6 is an electrical schematic diagram of the local coil of FIG. 2; and

DESCRIPTION OF THE PREFERRED EMBODIMENTS

Figure 1:
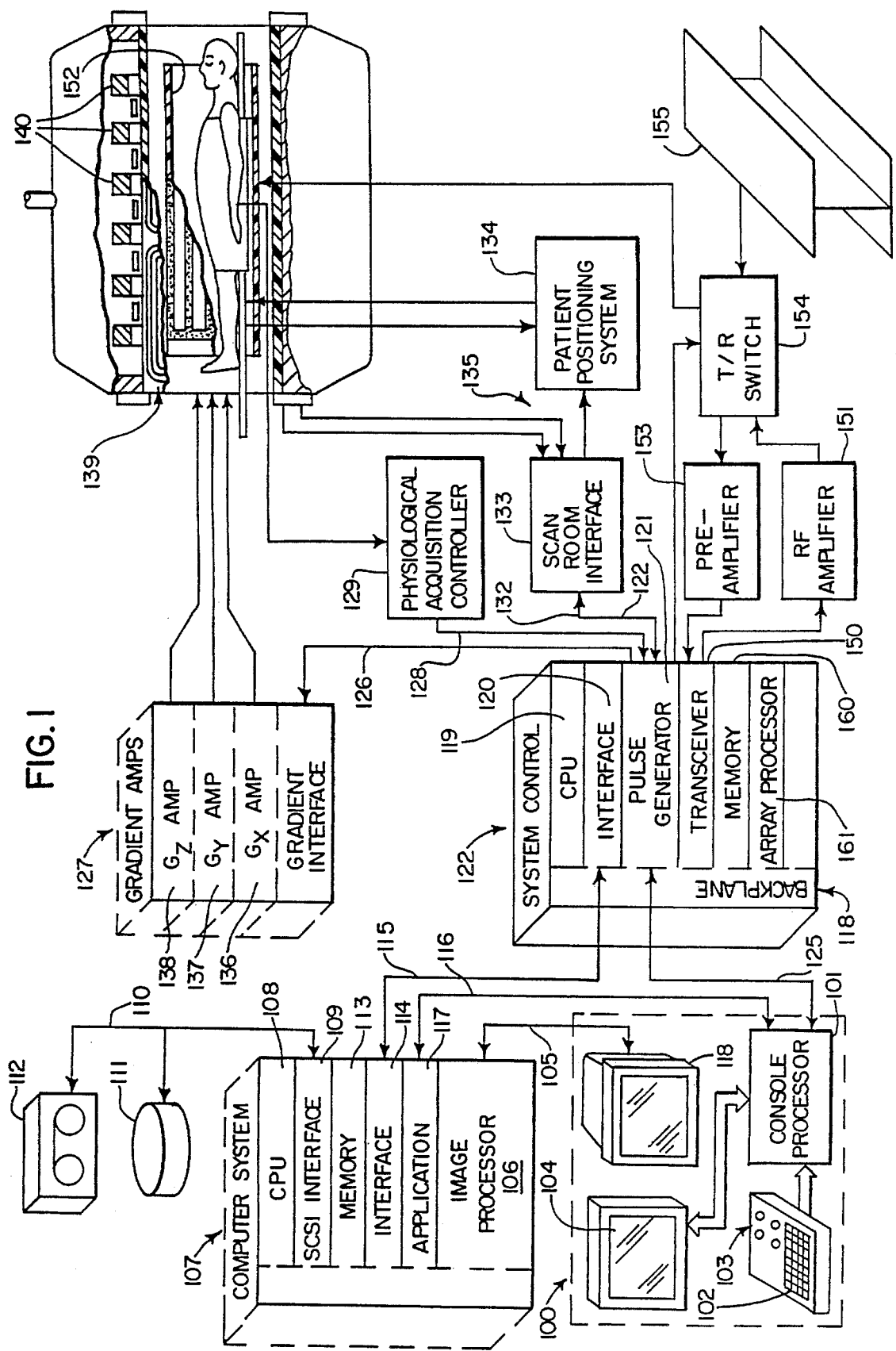
FIG. 1 is a block diagram of an NMR system which employs the present invention.

Referring first to FIG. 1, there is shown the major components of an NMR system with which the present invention may be used. The operation of the system is controlled from an operator console 100 which includes a console processor 101 that scans a keyboard 102 and receives inputs from a human operator through a control panel 103 and a plasma display/touch screen 104. The console processor 101 communicates through a communications link 116 with an applications interface module 117 in a separate computer system 107. Through the keyboard 102 and controls 103, an operator controls the production and display of images by an image processor 106 in the computer system 107, which connects directly to a video display 118 on the console 100 through a video cable 105.

The computer system 107 includes a number of modules which communicate with each other through a backplane. In addition to the application interface 117 and the image processor 106, these include a CPU module 108 that controls the backplane, and an SCSI interface module 109 that connects the computer system 107 through a bus 110 to a set of peripheral devices, including disk storage 111 and tape drive 112. The computer system 107 also includes a memory module 113, known in the art as a frame buffer for storing image data arrays, and a serial interface module 114 that links the computer system 107 through a high speed serial link 115 to a system interface module 120 located in a separate system control cabinet 122.

The system control 122 includes a series of modules which are connected together by a common backplane 118 controlled by a CPU module 119. The serial interface module 120 connects this backplane 118 to the high speed serial link 115, and pulse generator module 121 connects the backplane 118 to the operator console 100 through a serial link 125. It is through this link 125 that the system control 122 receives commands from the operator which indicate the scan sequence that is to be performed.

The pulse generator module 121 operates the system components to carry out the desired scan sequence. The pulse generator module 121 connects through serial link 126 to a set of gradient amplifiers 127, and it conveys data thereto which indicates the timing and shape of the gradient pulses that are to be produced during the scan. The pulse generator module 121 also receives patient data through a serial link 128 from a physiological acquisition controller 129. And finally, the pulse generator module 121 connects through a serial link 132 to scan room interface circuit 133 which receives signals at inputs 135 from various sensors associated with the position and condition of the patient and the magnet system. It is also through the scan room interface circuit 133 that a patient positioning system 134 receives commands which move the patient cradle and transport the patient to the desired position for the scan.

The gradient waveforms produced by the pulse generator module 121 are applied to a gradient amplifier system 127 comprised of $G_x$, $G_y$ and $G_z$ amplifiers 136, 137 and 138, respectively. Each amplifier 136, 137 and 138 is utilized to excite a corresponding gradient coil in an assembly generally designated 139. The gradient coil assembly 139 forms part of a magnet assembly which includes a polarizing magnet 140 that produces a polarizing field that extends horizontally through a bore 142. The gradient coils 139 encircle the bore 142, and when energized, they generate magnetic fields in the same direction as the main polarizing magnetic field, but with gradients $G_x$, $G_y$ and $G_z$ directed in the orthogonal x-, y- and z-axis directions of a Cartesian coordinate system.

Located within the bore 142 is a circular cylindrical whole-body RF coil 152. This coil 152 produces a circularly polarized RF field in response to RF pulses provided by a transceiver module 150 in the system control cabinet 122. These pulses are amplified by an RF amplifier 151 and coupled to the RF coil 152 by a transmit/receive switch 154. Waveforms and control signals are provided by the pulse generator module 121 and utilized by the transceiver module 150 for RF carrier modulation and mode control. The resulting NMR signals radiated by the excited nuclei in the patient may be sensed by the same RF coil 152 and coupled through the transmit/receive switch 154 to a preamplifier 153, although the transmit/receive switch 154 also enables the local coil assembly 155 of the present invention to be connected and to provide the NMR input signal to the preamplifier 153. As will be described below, the local coil assembly 155 is positioned in the bore 142, between the patient's legs when in use. The transmit/receive switch 154 is controlled by a signal from the pulse generator module 121 to electrically connect the RF amplifier 151 to the coil 152 during the transmit mode and to connect the preamplifier 153 to the local coil assembly 155 during the receive mode. As will be described below, some systems provide four separate receivers and associated preamplifiers which are connected separately to the local coil assembly 155. The amplified NMR signals are demodulated, filtered, and digitized in the receiver section of the transceiver 150.

The NMR signals picked up by the local coil assembly 155 are digitized by the transceiver module 150 and transferred to a memory module 160 which is also part of the system control 122. When the scan is completed and an entire array of data has been acquired in the memory modules 160, an array processor 161 operates to Fourier transform the data into an array of image data. This image data is conveyed through the serial link 115 to the computer system 107 where it is stored in the disk memory 111. In response to commands received from the operator console

100, this image data may be archived on the tape drive 112, or it may be further processed by the image processor 106 and conveyed to the operator console 100 and presented on the video display 118.

An optional feature available on some commercially available NMR systems is a plurality of input channels for receiving simultaneously the separate NMR signals produced by phased-array local coils such as that disclosed in U.S. Pat. No. 4,825,162 entitled "*Nuclear Magnetic Resonance* (NMR) *Imaging With Multiple Surface Coils*". Four separate preamplifiers and receivers are provided, and data is acquired from each of four coils. From this data, four separate images can be reconstructed and combined to form a single image. Two embodiments of the invention are described below, the first for use with systems having the four separate input channels, and the second for use with conventional, single-input channel systems.

Figure 2:
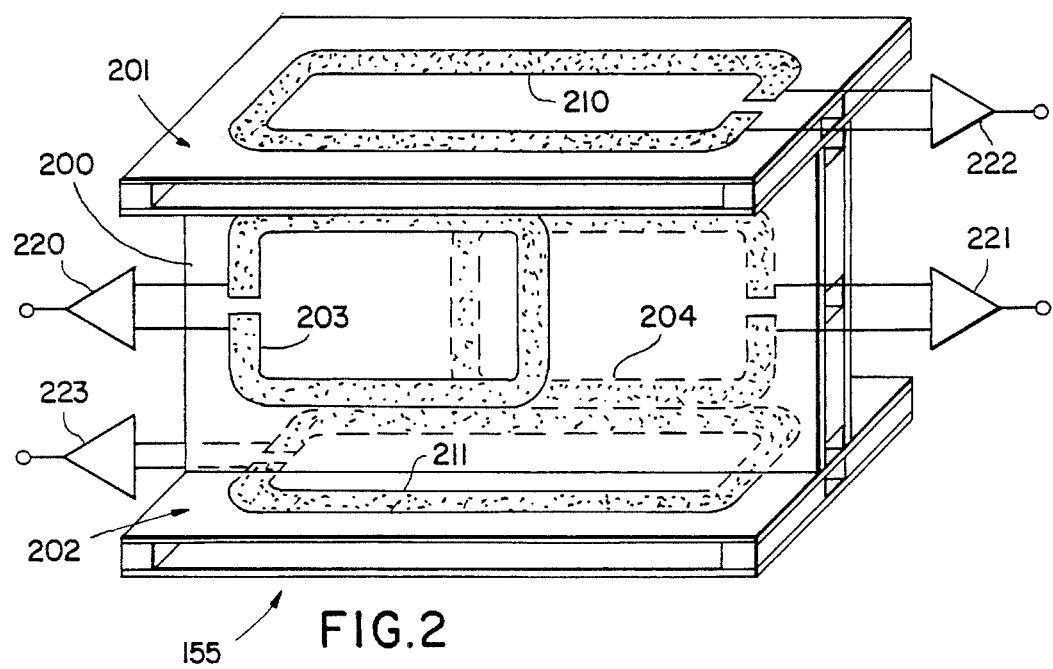
FIG. 2 is a pictorial representation of a first preferred embodiment of the local coil of the present invention.

Referring particularly to FIG. 2, the first embodiment of the invention has an I-beam shape formed by a vertical web section 200 bounded on the top and bottom by flange sections 201 and 202. A central coil array comprised of first single-loop coil 203 and a second single-loop coil 204 are formed on the web 200. The coils 203 and 204 are copper foils formed using printed circuit techniques, with coil 203 being formed on one side of the web 200 and the coil 204 being formed on the other side. The coils overlap as shown and the geometry of the coils 203 and 204 and the amount of overlap is selected to minimize the mutual inductance (M) between them. An isolation between the two coils 203 and 204 of approximately 15 dB is achieved when the local coil assembly 155 is placed between the legs 205 of a patient as shown in FIG. 4. For a description of how the mutual inductance is reduced between overlapping coils, reference is made to the above-cited U.S. Pat. No. 4,825,162 which is incorporated herein by reference.

Formed on the top and bottom flanges 201 and 202 are respective single-loop coils 210 and 211. These are also formed by copper foil using printed circuit techniques, and because they are oriented substantially orthogonal to the plane of the central coils 203 and 204, their magnetic fields are also substantially orthogonal to the fields produced by central coils 203 and 204. As a result, the mutual inductance between the horizontally aligned flange coils 210 and 211 and the vertically aligned central coils 203 and 204 is minimal. This provides an isolation of about 15 dB. The coils 210 and 211 are nearly 20 inches long and 6 inches wide, and they are spaced apart approximately 8 inches by the central web 200, and this spacing is sufficient to reduce the mutual inductance between the coils 210 and 211 to a level which provides about 15 dB of isolation.

The four coils 203, 204, 210 and 211 are connected to pre-amplifiers 220–223 for the four receive channels on the NMR system. The separately acquired signals are stored and used to reconstruct four separate images. These images are combined on a pixel-by-pixel basis to form the final, low noise image of the patient's legs.

Figure 3:
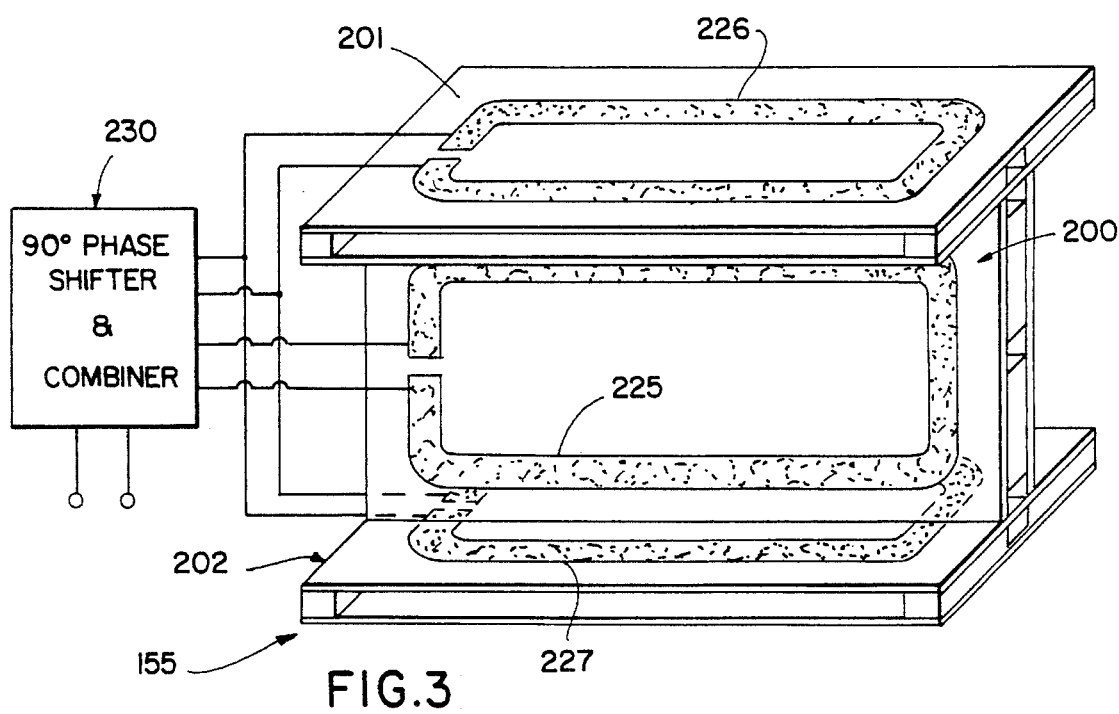
FIG. 3 is a pictorial representation of a second preferred embodiment of the present invention.

Referring particularly to FIG. 3, the second embodiment of the invention is designed for use on a conventional, single receive channel NMR system. Its physical construction is quite similar to the first embodiment described above, in that it includes a vertical, central web 200 bounded on the top and bottom by horizontal flanges 201 and 202. However, in this embodiment the central coil is comprised of a single-loop 225 which is virtually identical to the single-loop coils 226 and 227 formed on respective flanges 201 and 202. Because of its larger size, the central coil 225 does not have as good a sensitivity as the central coil array 203 and 204 in the first embodiment, but otherwise, performance of the coils is very similar. Again, mutual inductance is minimized by the orthogonality between the central coil 225 and the flange coils 226 and 227, and by the space between the flange coils 226 and 227.

The signals produced by flange coils 226 and 227 are combined to form a single signal which is applied to one channel of a 90° phase shifter and combiner 230. A hybrid combiner such as the type QHC-3-60 manufactured by Merrimac of West Caldwell, New Jersey may be used for this purpose. The signal from central coil 225 is applied to the other input of circuit 230 and is shifted 90° in phase before being combined with the flange coil signals. The resulting single signal is applied to the preamplifier 153 of the single receive channel.

When the local coil assembly 155 is placed between the legs of a patient as shown in FIG. 4, the central coil is disposed very close to vessels which run the length of the legs 205. As a result, the central coil is very sensitive to the NMR signals emanating from these vessels and the health of this vasculature can be determined using magnetic resonance angiography (MRA) techniques. In addition, the field of view of the local coil assembly 155 is nearly 20 inches long and spans nearly the entire length of the lower or upper part of the average human leg. As a result, all the vasculature in the thigh or the calf can be imaged during a single scan without pausing to withdraw the patient from the bore and reposition the local coil. It is also contemplated that the same local coil structure can be duplicated to double the length of the local coil assembly 155. In such case, one set of coils would be connected to the receiver channels while scanning the lower leg, and the second set of identical coils would be switched to drive the receiver channels while scanning the upper leg. The patient need not be moved, therefore, to conduct a scan of the entire leg.

Referring particularly to FIG. 5, the single-channel version of the local coil 155 is comprised of three single-loop coils 225–227. Each coil 225–227 includes a decoupling circuit comprised of capacitor 300, inductor 302 and diode 303. When the whole body RF coil 152 (FIG. 1) is energized to excite spins, the diodes 303 are conductive to effectively short circuit the capacitors 300, and to thereby detune each coil 225–227. By detuning these coils 225–227, they do not disturb the homogeneous RF excitation field produced by the whole body coil 152. The capacitors 300 and 301 along with distributed capacitance 304 and 305 and distributed inductance 306 tune the coils 225–227 to the Larmor frequency of the excited spins when the whole body RF coil 152 is de-energized and the system is in the receive mode in which the NMR signals are being picked up. The diodes 303 can be actively driven by a signal from the pulse generator 121, or they can be passively controlled as is known to those skilled in the art. As explained above, the coils 226 and 227 are orthogonal to the coil 225, thereby minimizing mutual inductance between the coils for optimal quadrature reception.

Referring particularly to FIG. 6, the four-channel version of the local coil 155 is comprised of four single-loop coils 203, 204, 210 and 211. Each coil includes a decoupling circuit comprised of capacitor 310, inductor 312 and diode 313. As with the single-channel embodiment described above, the decoupling circuits detune each coil 203, 204, 210 and 211 when the whole-body RF coil 152 is active so that they do not disrupt the homogeneity of the RF excitation field. Each coil 203, 204, 210 and 211 is tuned to the Larmor frequency of the excited spins by distributed capacitance 314 and 315 and distributed inductance 316. As indicated above, mutual inductance M between coils 203 and 204 is minimized by properly shaping and over lapping them, and mutual inductance M between coils 210 and 211 is minimized by their physical spacing. Mutual inductance between coil pair 203, 204 and coil pair 210, 211 is minimal due to their orthogonal orientation to each other.

Figure 7:
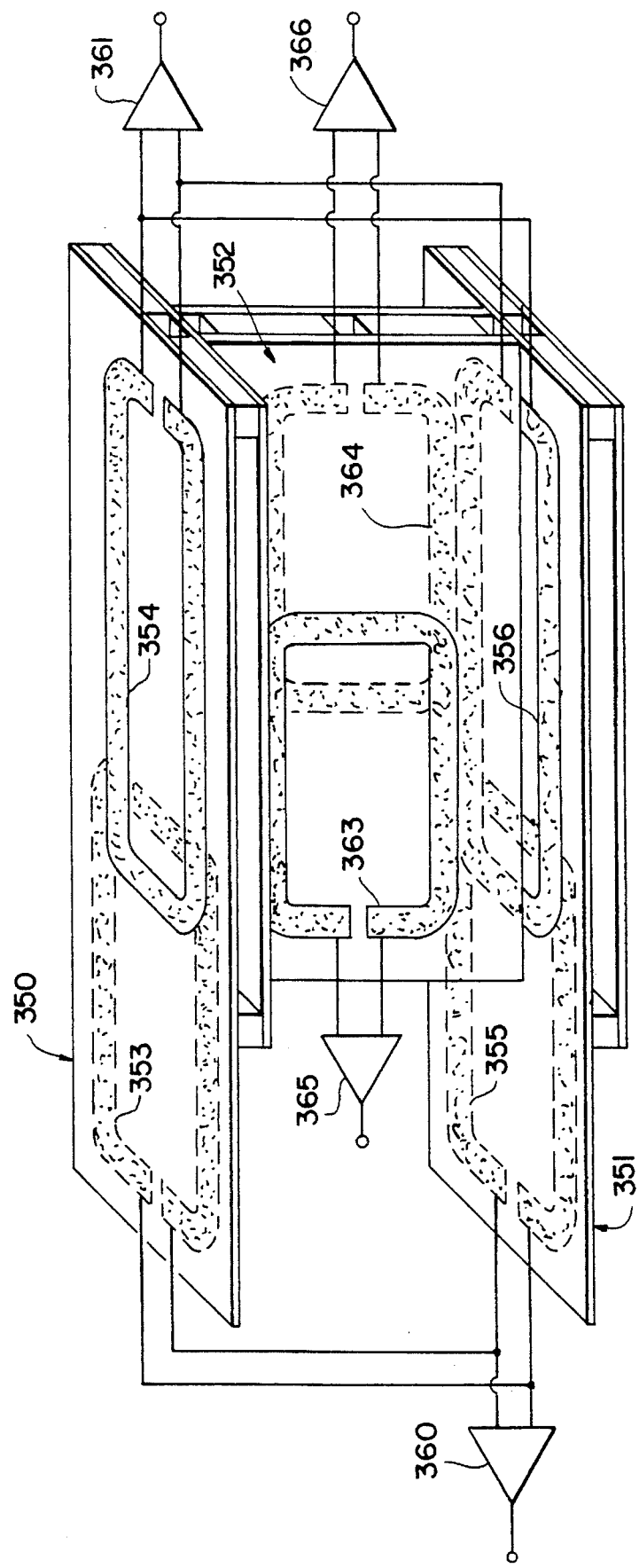
FIG. 7 is a pictorial representation of a third embodiment of the invention.

Referring particularly to FIG. 7, yet another embodiment of the invention includes flange sections 350 and 351 which extend beyond the lengthwise dimension of a web 352 such that NMR data may be acquired from the pelvic region of the patient when the web 352 is placed between the patient's thighs. A pair of overlapping, single loop coils 353 and 354 are formed on the flange 350 and an identical pair of coils 355 and 356 are formed on the flange 351. The overlap of the coils 353 and 354 and the coils 355 and 356 is such that the mutual inductance between the coils are minimized. The coils 353 and 355 are connected to one receiver channel preamplifier 360, and the NMR signals which they acquire are produced in the patient's pelvic region. The other pair of opposing flange coils 354 and 356 connect to a second receiver channel preamplifier 361 and they acquire NMR signals from the patient's thighs.

A pair of single loop, overlapping coils 363 and 364 are formed on the web 352 and located between the coil pair 354/356 to also acquire NMR signals from the patient's thigh area. Each coil 363 and 364 connects to respective receiver preamplifiers 365 and 366.

It should be apparent to those skilled in the art that many variations are possible from the preferred embodiments described above. For example, either of the flange coils may also be comprised of coil arrays rather than the single-loop coil shown, and more than two coils can be employed in the central coil array. A number of methods for minimizing mutual inductance between coils in such arrays are known to those skilled in the art, and any of these may be used to preserve the SNR gained by using smaller local coils to cover the elongated field of view.

We claim:

1. A local coil for acquiring NMR signals produced by excited spins in the legs of a patient, the combination comprising:

a central coil disposed in a first plane and positioned between the patient's legs, and extending along the lengthwise dimension of the legs, the central coil being operable to produce a signal in response to NMR signals emanating from the legs;

a first flange coil disposed in a second plane substantially perpendicular to the first plane and positioned to extend over the top of both of the patient's legs, and extending along the lengthwise dimension substantially coextensively with the central coil, the first flange coil being operable to produce a second signal in response to NMR signals emanating from the patient's leg;

a second flange coil disposed in a third plane substantially perpendicular to the first plane and positioned to extend beneath both of the patient's legs, and extending along the lengthwise dimension substantially coextensively with the central coil, the second flange coil being operable to produce a third signal in response to NMR signals emanating from the patient's legs; and means for combining the signals acquired from said three coils to produce an image of the patient's leg.

2. The local coil as recited in claim 1 in which the central coil is comprised of a plurality of separate coils disposed along the lengthwise dimension.

3. The local coil as recited in claim 2 in which the plurality of separate coils in the central coil are configured to minimize the mutual inductance therebetween.

4. The local coil as recited in claim 1 in which the first and second flange coils are each comprised of a plurality of separate coils disposed along the lengthwise dimension.

5. The local coil as recited in claim 4 in which the first and second flange coils extend beyond the lengthwise dimension of the central coil to enable the acquisition of NMR signals from the pelvic region adjacent the patient's legs.

* * * * *